ис010131147B2

(12) United States Patent
Stewart

(10) Patent No.: US 10,131,147 B2
(45) Date of Patent: Nov. 20, 2018

(54) METHODS OF MAKING AN INKJET PRINT HEAD BY SAWING DISCONTINUOUS SLOTTED RECESSES

(71) Applicant: STMICROELECTRONICS, INC., Coppell, TX (US)

(72) Inventor: Kenneth J. Stewart, Coppell, TX (US)

(73) Assignee: STMICROELECTRONICS, INC., Coppell, TX (US)

(*) Notice: Subject to any disclaimer, the term of this patent is extended or adjusted under 35 U.S.C. 154(b) by 265 days.

(21) Appl. No.: 14/941,898

(22) Filed: Nov. 16, 2015

(65) Prior Publication Data
US 2016/0067970 A1 Mar. 10, 2016

Related U.S. Application Data

(62) Division of application No. 13/906,477, filed on May 31, 2013, now Pat. No. 9,346,273.

(51) Int. Cl.
*B41J 2/16* (2006.01)
*B41J 2/14* (2006.01)
*H01L 21/78* (2006.01)
*B41J 2/145* (2006.01)
*B28D 5/02* (2006.01)

(52) U.S. Cl.
CPC ............ *B41J 2/1632* (2013.01); *B41J 2/145* (2013.01); *B41J 2/14112* (2013.01); *B41J 2/14129* (2013.01); *B41J 2/1601* (2013.01); *B41J 2/162* (2013.01); *B41J 2/1603* (2013.01); *B41J 2/1635* (2013.01); *H01L 21/78* (2013.01); *B28D 5/022* (2013.01); *B28D 5/027* (2013.01); *B41J 2002/14491* (2013.01); *Y10T 29/42* (2015.01); *Y10T 29/49083* (2015.01); *Y10T 29/49401* (2015.01); *Y10T 29/49798* (2015.01)

(58) Field of Classification Search
CPC .... B41J 2/14112; B41J 2/14129; B41J 2/145; B41J 2/1601; B41J 2/1603; B41J 2/162; B41J 2/1632; B41J 2/1635; B41J 2002/14491; B28D 5/022; B28D 5/027; H01L 21/78; Y10T 29/42; Y10T 29/49083; Y10T 29/49401; Y10T 29/49798
See application file for complete search history.

(56) References Cited

U.S. PATENT DOCUMENTS 4,250,603 A 2/1981 Luft
5,000,811 A 3/1991 Campanelli
(Continued)

FOREIGN PATENT DOCUMENTS

JP 2006093241 A * 4/2006
JP 2008213336 9/2008

*Primary Examiner* — A. Dexter Tugbang
(74) *Attorney, Agent, or Firm* — Slater Matsil, LLP

(57) ABSTRACT

A method of making an inkjet print head may include forming, by sawing with a rotary saw blade, first discontinuous slotted recesses in a first surface of a wafer. The first discontinuous slotted recesses may be arranged in parallel, spaced apart relation. The method may further include forming, by sawing with the rotary saw blade, second discontinuous slotted recesses in a second surface of the wafer aligned and coupled in communication with the first continuous slotted recesses to define through-wafer channels. In another embodiment, the first and second plurality of discontinuous recesses may be formed by respective first and second rotary saw blades.

19 Claims, 11 Drawing Sheets

(56) References Cited

U.S. PATENT DOCUMENTS

| | | | |
|---|---|---|---|
| 5,998,234 A * | 12/1999 | Murata | H01L 21/78 |
| | | | 257/E21.599 |
| 7,326,356 B2 | 2/2008 | Bresciani et al. | |
| 7,802,868 B2 | 9/2010 | Ohta | |
| 7,966,728 B2 | 6/2011 | Buswell | |
| 9,409,394 B2 * | 8/2016 | Stewart | B41J 2/1635 |
| 2002/0180825 A1 | 12/2002 | Buswell et al. | |
| 2007/0240309 A1 | 10/2007 | Buswell et al. | |

* cited by examiner

METHODS OF MAKING AN INKJET PRINT HEAD BY SAWING DISCONTINUOUS SLOTTED RECESSES

FIELD OF THE INVENTION

The present invention relates to inkjet printers, and more particularly, to methods of making inkjet print heads.

BACKGROUND OF THE INVENTION

Modern ink jet printers may produce photographic-quality images. An inkjet printer includes a number of orifices or nozzles spatially positioned in a printer cartridge. Ink is heated when an electrical pulse energizes a resistive element forming a thermal resistor. The ink resting above the thermal resistor is ejected through the orifice towards a printing medium, such as an underlying sheet of paper as a result of the applied electrical pulse.

The thermal resistor is typically formed as a thin film resistive material on a semiconductor substrate as part of a semiconductor chip, for example. Several thin film layers may be formed on the semiconductor chip, including a dielectric layer carried by the substrate, a resistive layer forming the thermal resistor, and an electrode layer that defines electrodes coupled to the resistive layer to which the pulse is applied to heat the thermal resistor and vaporize the ink.

A first phase of making a print head, which may include the components described above, may follow standard semiconductor processing techniques to form circuitry for controlling the inkjet print head. The control circuitry may be formed on a front side of a silicon wafer, for example, a silicon wafer having a <100> crystalline orientation and 675-725 micron thickness.

Once the circuit formation processing steps are completed, two additional phases for making a print head are typically followed. These phases are generally classified as micro electro-mechanical systems (MEMS) processing steps. One of these MEMS phases may include forming three-dimensional structures that function as inkjet chambers, which may be formed on the same side of the wafer as the control circuitry. The thermal resistor or heater, which is described above, may be carried by a floor of each inkjet chamber. Each inkjet chamber acts as a small room into which ink flows. A roof of each inkjet chamber typically includes an opening, which may be referred to as an orifice, bore, or nozzle plate, for example.

The other MEMS processing phase may include forming through-wafer ink channels to allow ink to flow from a reservoir or supply at the backside of the wafer to each inkjet chamber. This MEMS phase may be relatively expensive. For example, one method of forming the through-wafer ink channels is deep reactive ion etching (DRIE) of silicon, which uses relatively expensive equipment and has a very low throughput. Another common method is laser cutting, which also uses relatively expensive equipment and has a very low throughput.

One technique for forming a through-wafer ink channel includes forming an ink feed slot in a substrate using a saw. More particularly, U.S. Pat. No. 7,966,728 to Buswell discloses using a circular cutting disk or saw positioned above a first surface of a substrate to cut a desired depth of the substrate.

SUMMARY

A method of making a plurality of inkjet print heads may include forming, by sawing with a rotary saw blade, a first plurality of discontinuous slotted recesses in a first surface of a wafer. The first plurality of discontinuous slotted recesses may be arranged in parallel, spaced apart relation. The method may also include forming, by sawing with the rotary saw blade, a second plurality of discontinuous slotted recesses in a second surface of the wafer aligned and coupled in communication with the first plurality of continuous slotted recesses to define a plurality of through-wafer channels. In some embodiments, the first and second plurality of discontinuous slotted recesses may be formed with first and second rotary saw blades, respectively. Accordingly, the inkjet print heads may be made more efficiently, for example, with a reduced cost.

The first and second plurality of discontinuous slotted recesses may be formed to have a same depth into the wafer. In other embodiments, the first plurality of discontinuous slotted recesses may be formed to have a depth into the wafer greater than a depth of the second plurality of discontinuous slotted recesses, for example. The first and second plurality of discontinuous slotted recesses may also be formed by making overlapping cuts into the wafer with the rotary saw blade.

The method may further include forming a plurality of inkjet heaters and control circuitry on the wafer. The method may also include forming at least one layer on the wafer to define a plurality of inkjet chambers. The at least one layer may have a plurality of inkjet orifices formed therein, for example. The wafer may include a silicon wafer, for example.

DETAILED DESCRIPTION

The embodiments will now be described more fully hereinafter with reference to the accompanying drawings, in which preferred embodiments are shown. The embodiments may, however, be in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime notation is used to describe like elements in different embodiments.

Figure 1:
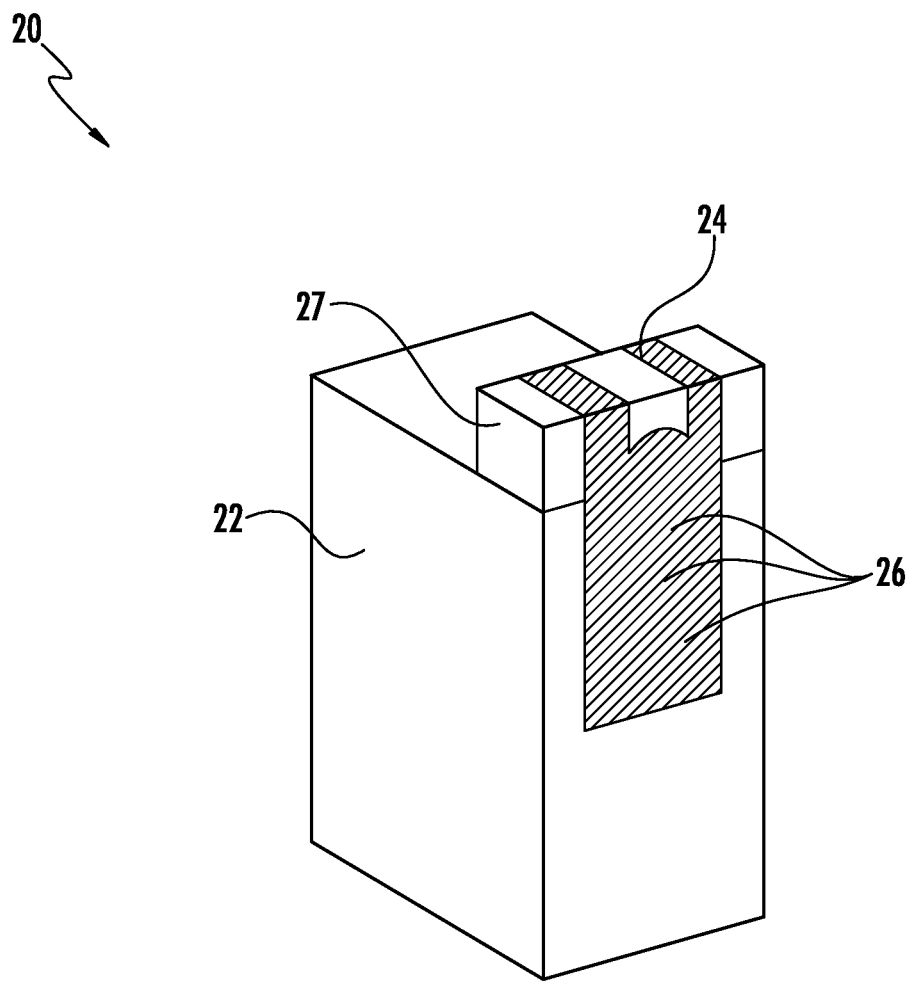
FIG. 1 is a perspective view of an inkjet print head cartridge that incorporates an inkjet print head made according to the invention.

Referring initially to FIG. 1, an inkjet print head cartridge 20 is now described. This inkjet print cartridge 20 includes a cartridge body 22 that includes ink, for example, for an inkjet print head. The ink is channeled from an ink supply through through-wafer ink channels into a plurality of inkjet chambers, each associated with a respective orifice 24 or print head nozzle positioned on the body 22 and configured to eject ink onto the paper or other print media. Electrical signals are provided to conductive traces 26 to energize thermal resistors or heater that heat the ink and eject a droplet of ink through an associated orifice 24.

The orifices 24 are typically located at an inkjet print head 27 of the print head cartridge 20. In an example, the print head cartridge 20 may include 300 or more orifices 24, each orifice 24 having an associated inkjet chamber 30, as will be appreciated by those skilled in the art. During manufacture, many print heads 27 may be formed to be included on a single silicon wafer and separated. Such methods of making inkjet print heads are described in further detail below.

Figure 2:
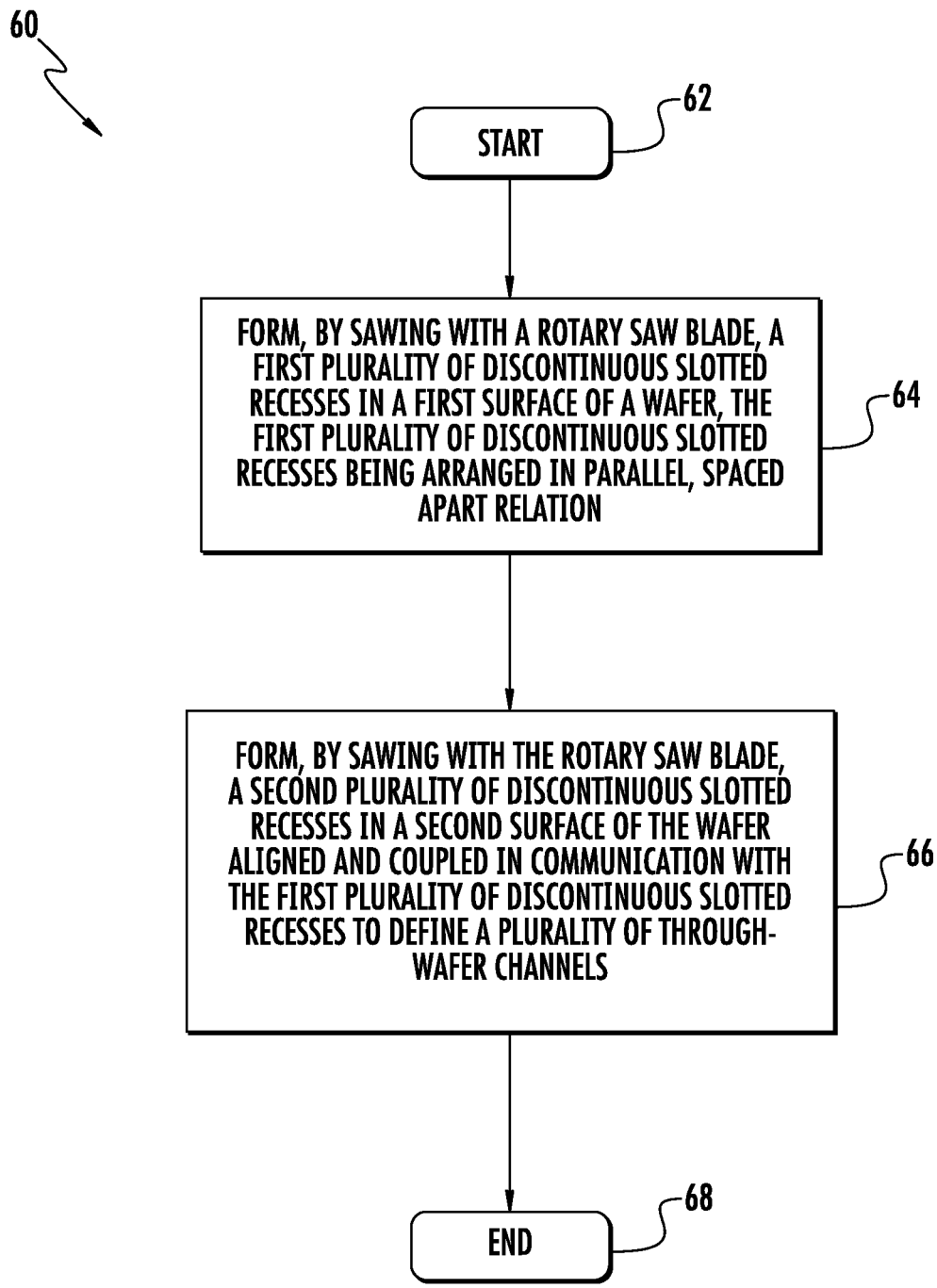
FIG. 2 is a flowchart of a method of making inkjet print heads in accordance with the invention.
Figure 3:
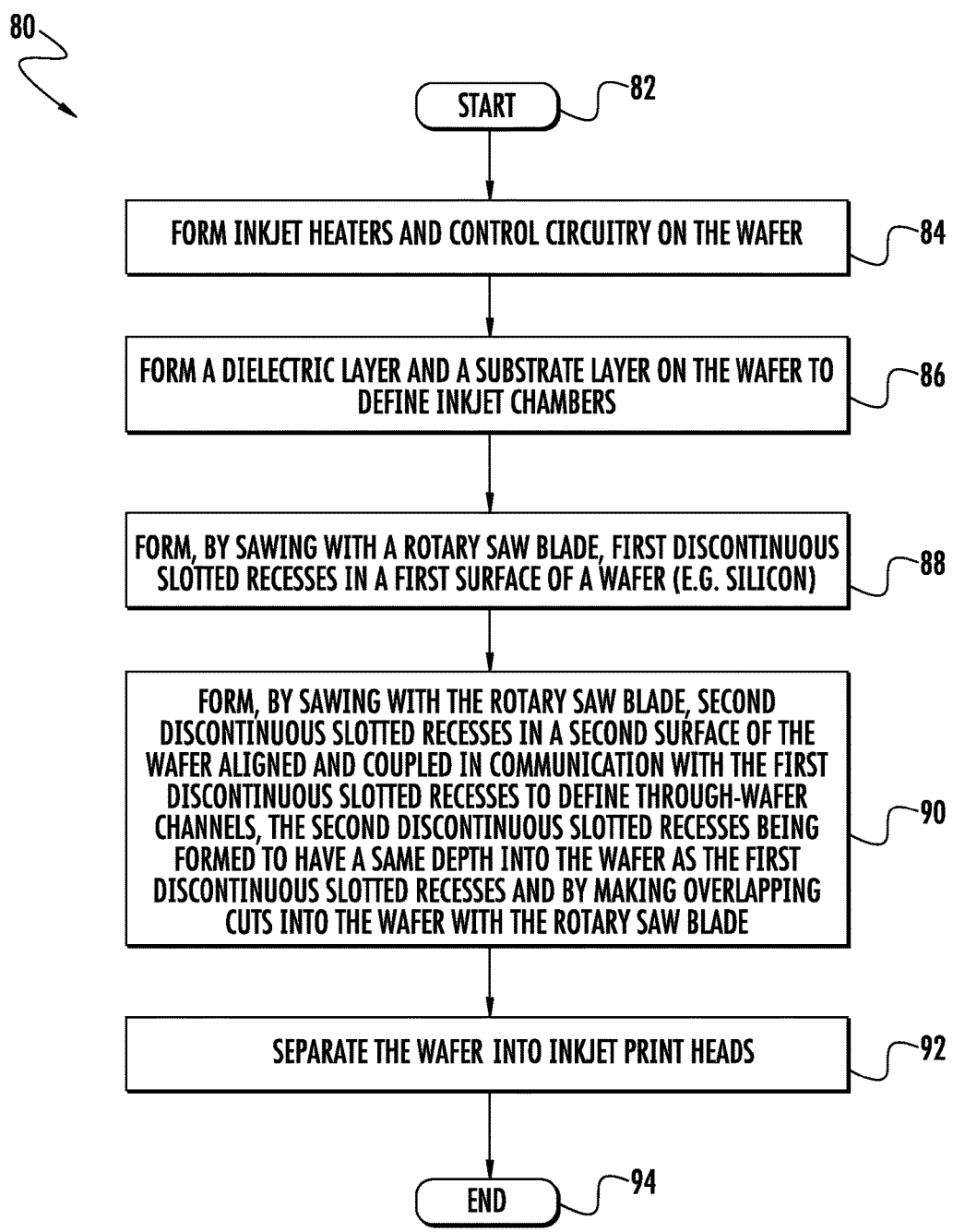
FIG. 3 is a more detailed flowchart of a method of making inkjet print heads in accordance with the invention.

Referring now to the flowchart 60 in FIG. 2, a method of making inkjet print heads 27 is described. Beginning at Block 62, the method includes, at Block 64, forming, by sawing with a rotary saw blade, first discontinuous slotted recesses in a first surface of a wafer. The first discontinuous slotted recesses are arranged in parallel, spaced apart relation. The method further includes, at Block 66, forming, by sawing with the rotary saw blade, second discontinuous slotted recesses in a second surface of the wafer aligned and coupled in communication with the first discontinuous slotted recesses to define a plurality of through-wafer channels 41. The method ends at Block 68.

Figure 6A:
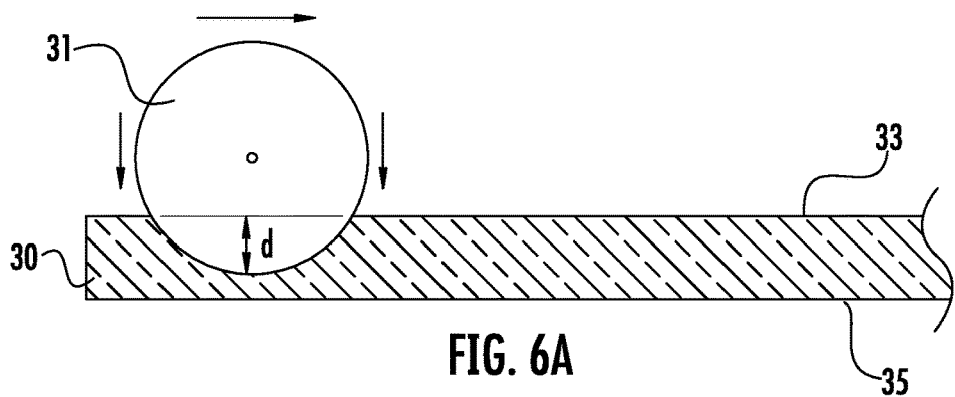
FIG. 6a is a cross-sectional view of a wafer having first discontinuous slotted recesses being sawed therein according to the method in the flowchart of FIG. 3.
Figure 6B:
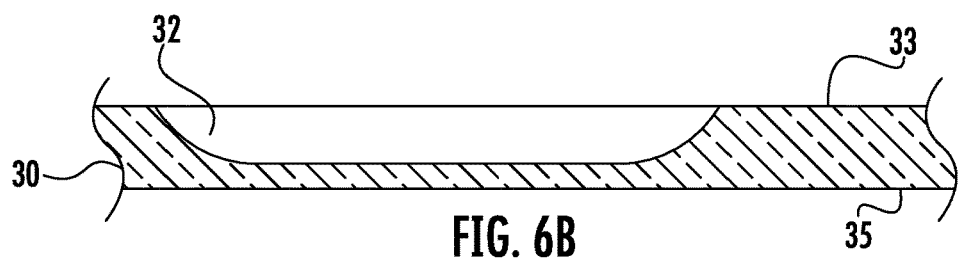
FIG. 6b is a cross-sectional view of the wafer of FIG. 6a having the first discontinuous slotted recesses formed therein.
Figure 6C:
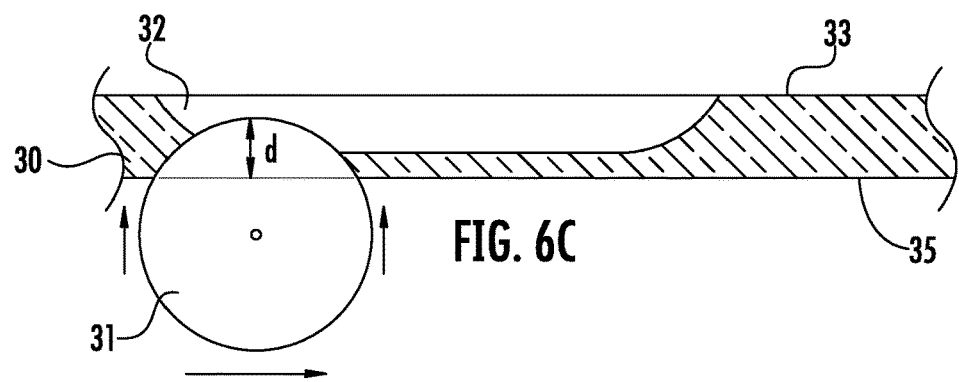
FIG. 6c is a cross-sectional view of the wafer of FIG. 6b having second discontinuous slotted recesses being sawed therein.
Figure 6D:
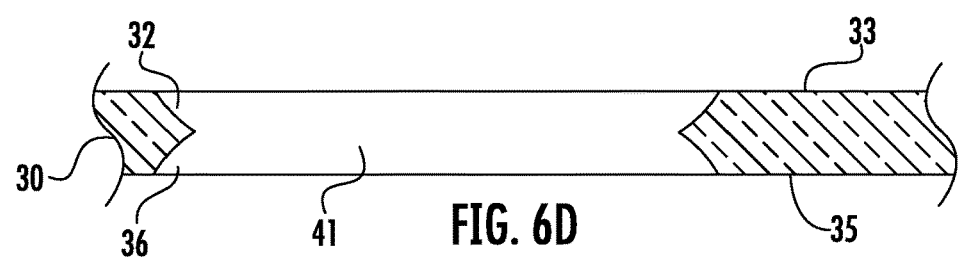
FIG. 6d is a cross-section view of the wafer of FIG. 6c having the first and second discontinuous slotted recessed formed therein.
Figure 7:
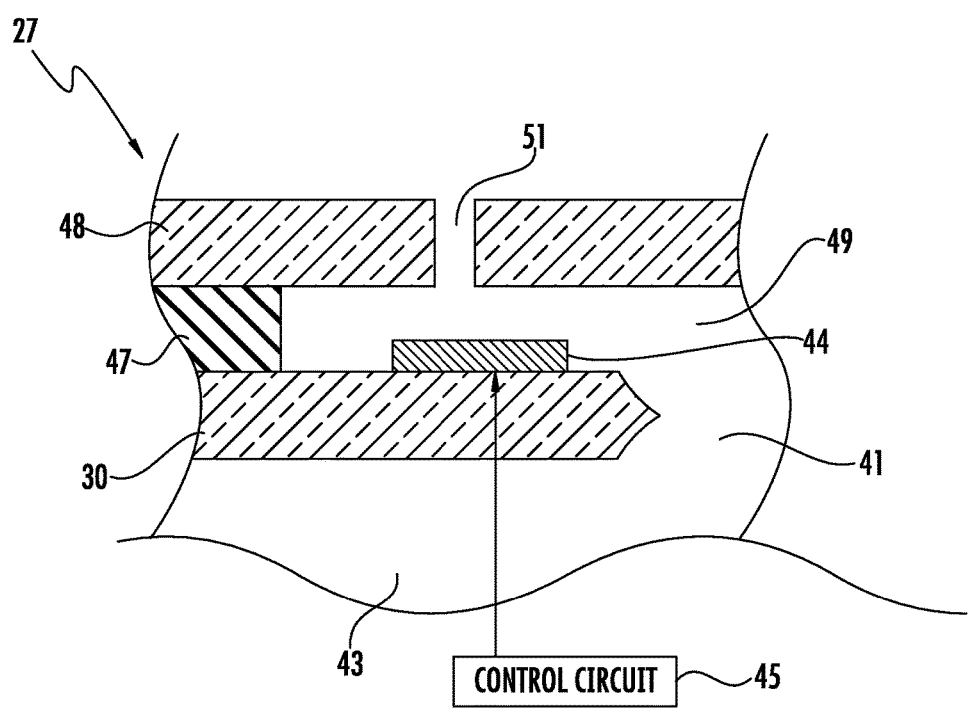
FIG. 7 is a cross-sectional view of an inkjet print head in accordance with the invention.

Referring now to the flowchart 80 in FIG. 3, and FIGS. 4-7, beginning at Block 82, a more detailed method of making inkjet print heads 27 is now described. At Block 84, the method includes forming inkjet heaters 45 and control circuitry 46 on the wafer 30 (FIG. 7). It will be appreciated that while a single inkjet heater and control circuitry 46 is illustrated, each inkjet print head 27 on the wafer has an inkjet heater and control circuitry. In other words, for ease of explanation, only a single inkjet print head 27.

The method also includes forming, at Block 86, a dielectric layer 47 and a substrate layer 48 on the wafer 30 to define inkjet chambers 49. In some embodiments, a single silicon substrate (i.e., layer) or second wafer may be formed on the wafer 30 to define the inkjet chambers 49 (FIG. 7). The substrate layer 48 has inkjet orifices 51 formed therein (FIG. 7). Again, while a portion of a single inkjet print head 27 is illustrated, it will be appreciated by those skilled in the art that the wafer 30 includes many inkjet print heads 27.

Figure 4:
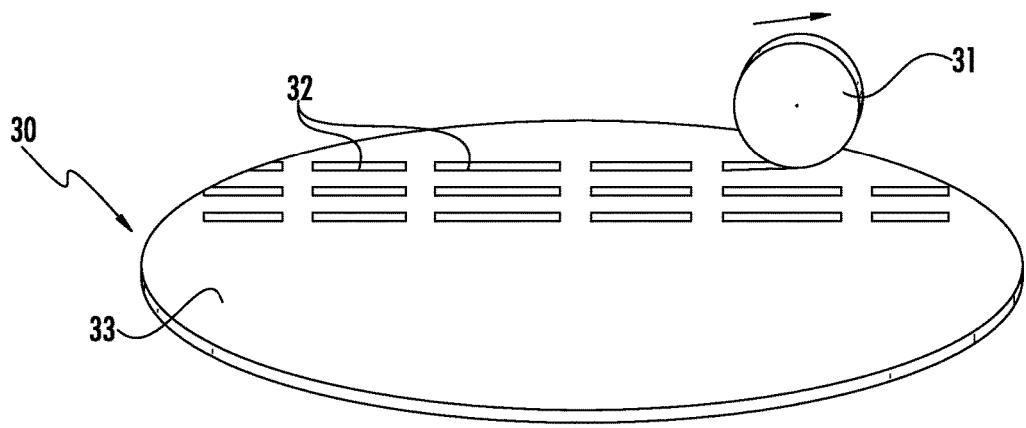
FIG. 4 is a perspective view of first discontinuous slotted recesses in a wafer formed according to the method in the flowchart of FIG. 3.
Figure 5:
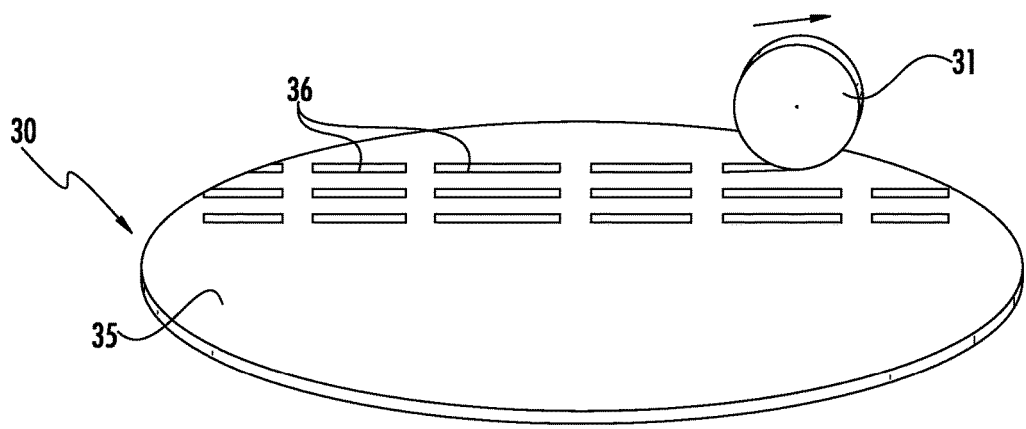
FIG. 5 is a perspective view of second discontinuous slotted recesses in a wafer formed according to the method in the flowchart of FIG. 3.

At Block 88, the method includes forming, by sawing with a rotary saw blade 31, first discontinuous slotted recesses 32 in a first surface 33 of a wafer 30. The wafer 30 may be silicon, for example. The first discontinuous slotted recesses 32 are formed to be arranged in parallel, spaced apart relation (FIG. 4).

To form the first discontinuous slotted recesses 32, the rotary saw blade 31 may be positioned at a starting point above the first surface 33 and moved to a desired x,y position for cutting a first discontinuous slotted recess (FIG. 6a). More particularly, the first discontinuous slotted recesses 32 may be sawed with a diamond saw, for example, similar to a diamond saw used for wafer dicing, and may have a diameter of 1-inch for example. Of course, the rotary saw blade 31 may have other dimensions.

The rotary saw blade 31 is moved downwardly to penetrate or cut into the first surface 33 and moved along the first surface in the x direction to a desired x,y position for the end of the first discontinuous slotted recess 32 (FIG. 6b). The rotary saw blade 31 is raised or moved upwardly to above the first surface 33 and indexed to the start x,y location of the next discontinuous slot in the first surface. Of course, multiple rotary saw blades may be used to form several rows of discontinuous slotted recesses in the first surface 33 of the wafer 30 at a same time, as will be appreciated by those skilled in the art.

The method includes, at Block 90 forming, by sawing with the rotary saw blade 31, second discontinuous slotted recesses 36 in a second surface 35 of the wafer 30 (FIG. 5) aligned and coupled in communication with the first discontinuous slotted recesses 32 to define through-wafer channels 41 (FIGS. 6c and 6d). The first and second discontinuous slotted recesses 32, 36 may be formed to have a same depth d into the wafer 30 (FIGS. 6a and 6c). Dimensions may include, for a 675 micron wafer, a desired depth of about 600 microns for each of the first and second discontinuous slotted recesses 32, 36. In this case, the cuts into the wafer with the rotary saw blade 31 for the first and second discontinuous slotted recesses 32, 36 overlap, for example, as illustrated in FIGS. 6a-6d. Of course, the first and second discontinuous recesses 32, 36 may be formed to have other depths that are the same. The depths of the cuts of the first and second discontinuous recesses 32, 36 into the wafer 30 may not be overlapping in some embodiments. It should be noted that for ease of explanation, FIGS. 4, 5, and 6a-6d do not illustrate the inkjet heaters 45 and control circuitry 46, as these may be formed prior to the sawing.

At Block 92, the wafer 30 is separated into inkjet print heads 27, for example, using silicon wafer dicing techniques as will be appreciated by those skilled in the art. If desired, the method may include removing additional portions of the wafer 30 within any of the first and second slotted discontinuous recesses 32, 36, for example, to modify the shape of the slotted discontinuous recesses, and particularly, the end regions of thereof. Additional portions of the wafer 30 may be removed, for example, by wet etching, dry or reactive ion etching, plasma etching, micro-abrasion, laser cutting, or any other or combination of techniques. The method ends at Block 94.

Figure 8:
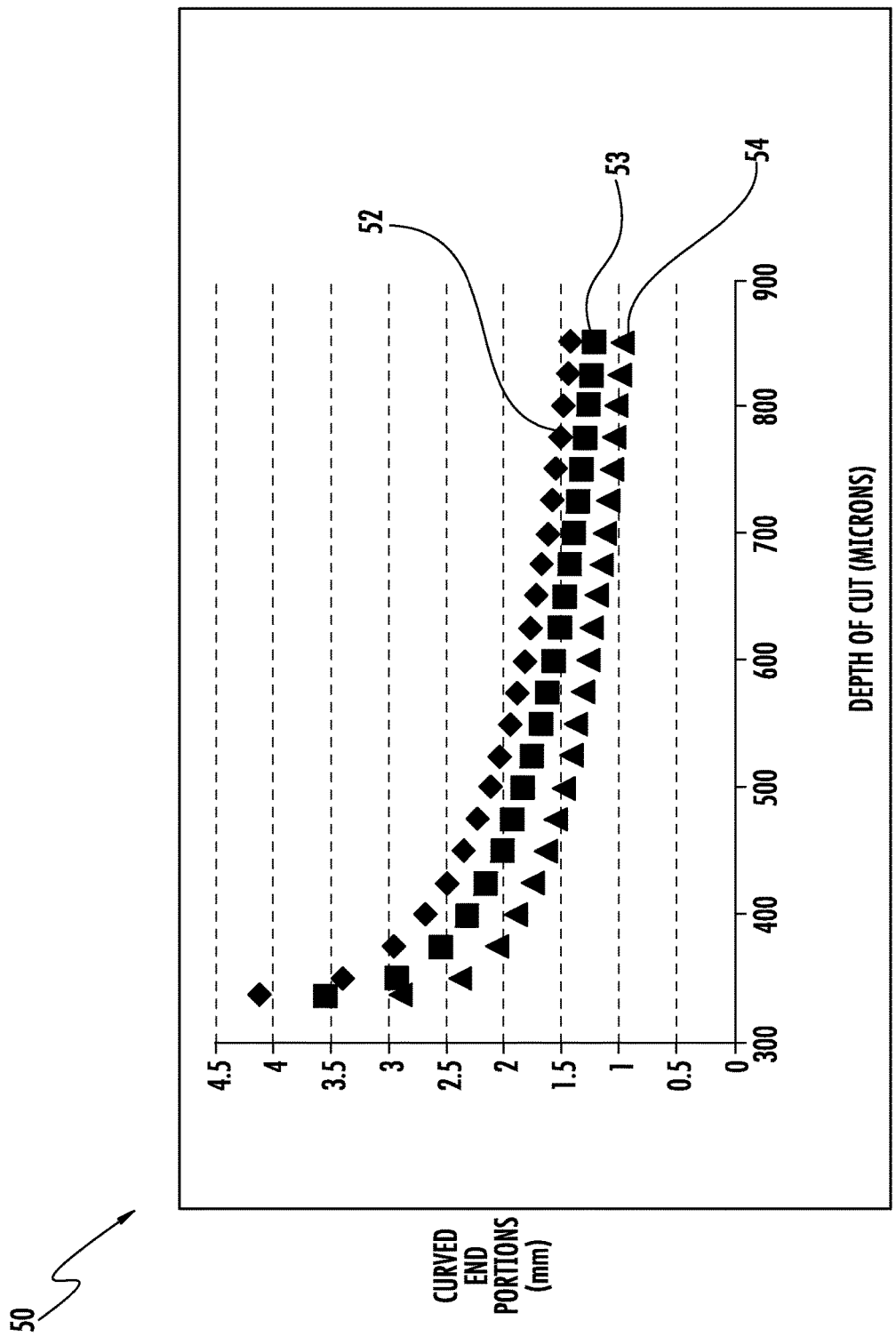
FIG. 8 is a graph of a depth of a discontinuous slotted recess versus a size of curved end portions of the through-wafer channels in accordance with the invention.
Figure 9:
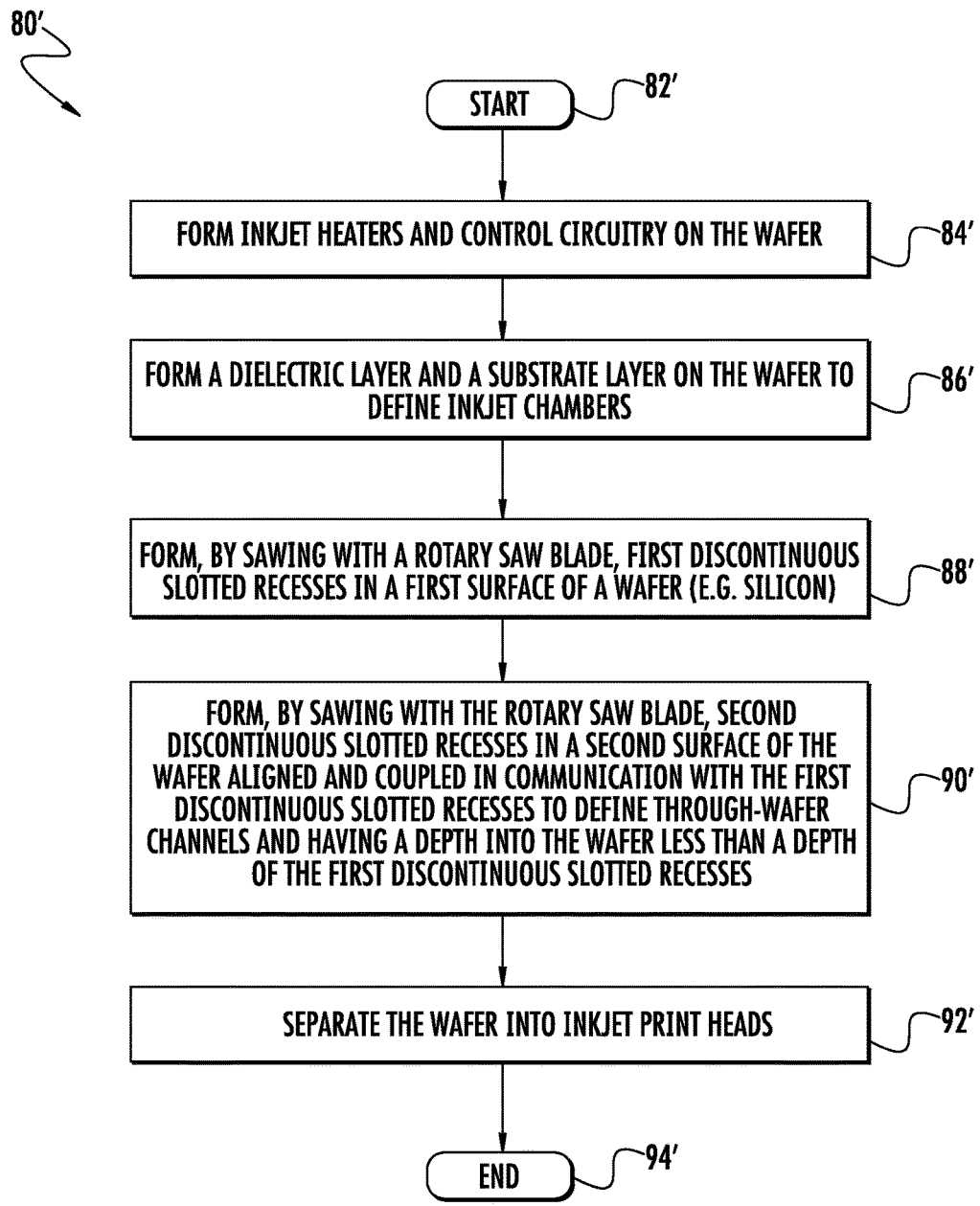
FIG. 9 is a flowchart of a method of making an inkjet print head in accordance with another embodiment of the invention.

Referring now to the graph 50 in FIG. 8, a comparison of the curved portion of the first and second discontinuous slotted recesses 32, 36 to the depth of the first and second discontinuous recesses through the wafer 30 is illustrated for three different diameter rotary saw blades: 2-inches 52, 1.5-inches 53, and 1-inch 54. Indeed, as a result from the sawing with the rotary saw blade 31, for example, equally from the first and second surfaces 33, 35, the curved portions at the end of the first and second discontinuous slotted recesses 32, 36 may be reduced. As will be appreciated by those skilled in the art, the equation for the graph 50 cuts off at Y=W/2, where Y is the depth of each of the first and second discontinuous slotted recesses 32, 36 and W is the thickness of the wafer 30 (i.e., half the thickness of the wafer), since slotted recesses less than this depth leaves material in the through-wafer channels 41. For example, with a 2-inch diameter rotary saw blade and a depth of the first and second discontinuous slotted recesses being 600 microns (from the first and second surfaces), then the curved portion is 1.288 mm based upon a length the of movement of the rotary saw blade 31 of 3 mm.

Figure 10A:
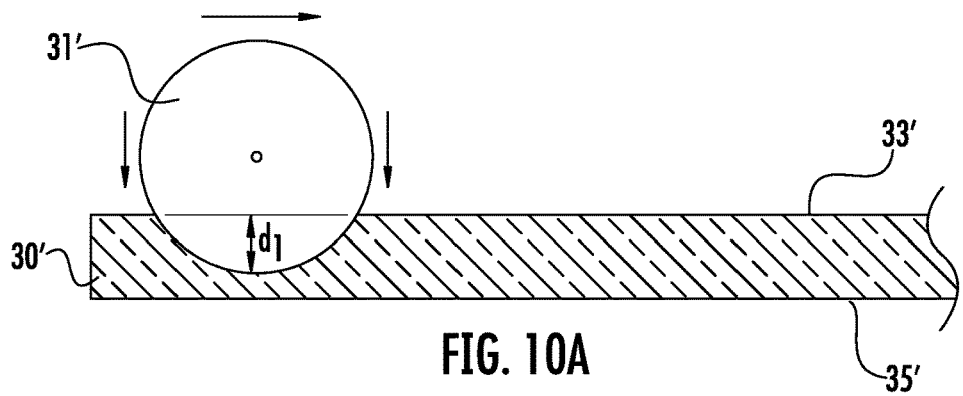
FIG. 10a is a cross-sectional view of a wafer having first discontinuous slotted recesses being sawed therein according to the method of FIG. 9.
Figure 10B:
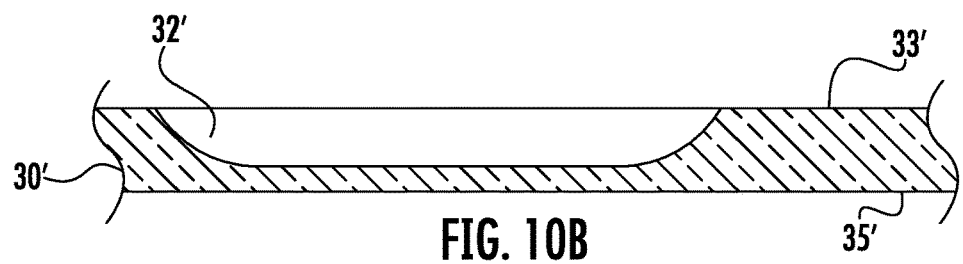
FIG. 10b is a cross-sectional view of the wafer of FIG. 10a having the first discontinuous slotted recesses formed therein.
Figure 10C:
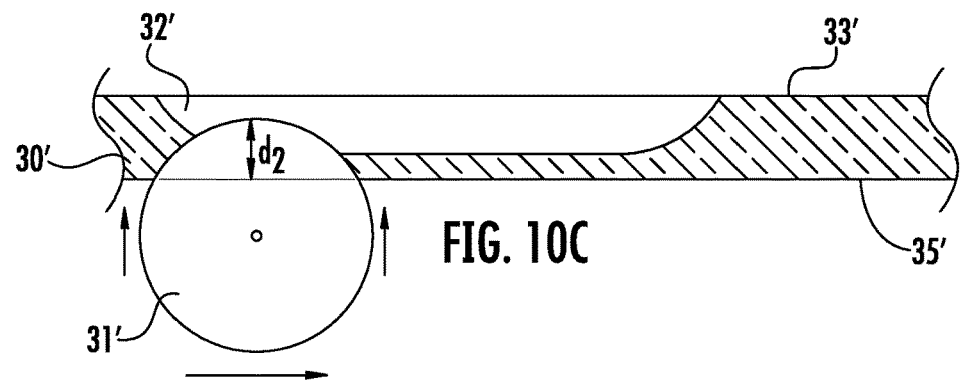
FIG. 10c is a cross-sectional view of the wafer of FIG. 10b having second discontinuous slotted recesses being sawed therein.
Figure 10D:
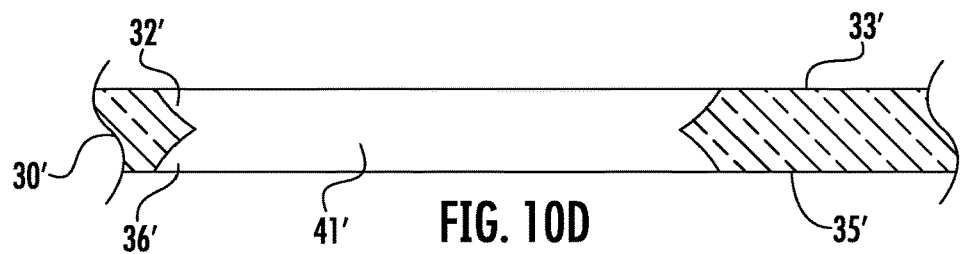
FIG. 10d is a cross-section view of the wafer of FIG. 10c having the first and second discontinuous slotted recessed formed therein.

Referring now to the flowchart 80' in FIG. 9, and FIGS. 10a-10d, in another embodiment, the first discontinuous slotted recesses 32' may be formed to have a depth $d_1$ into the wafer 30' greater than a depth $d_2$ of the second discontinuous slotted recesses 36' (FIGS. 10a and 10c). Of course, in other embodiments, the second discontinuous slotted recesses 36' may be formed to have a depth into the wafer 30' greater than a depth of the first discontinuous slotted recesses 32'. The other method steps are similar to those described above with respect the flowchart in FIG. 3, and FIGS. 4-7 and require no further discussion herein.

Figure 11:
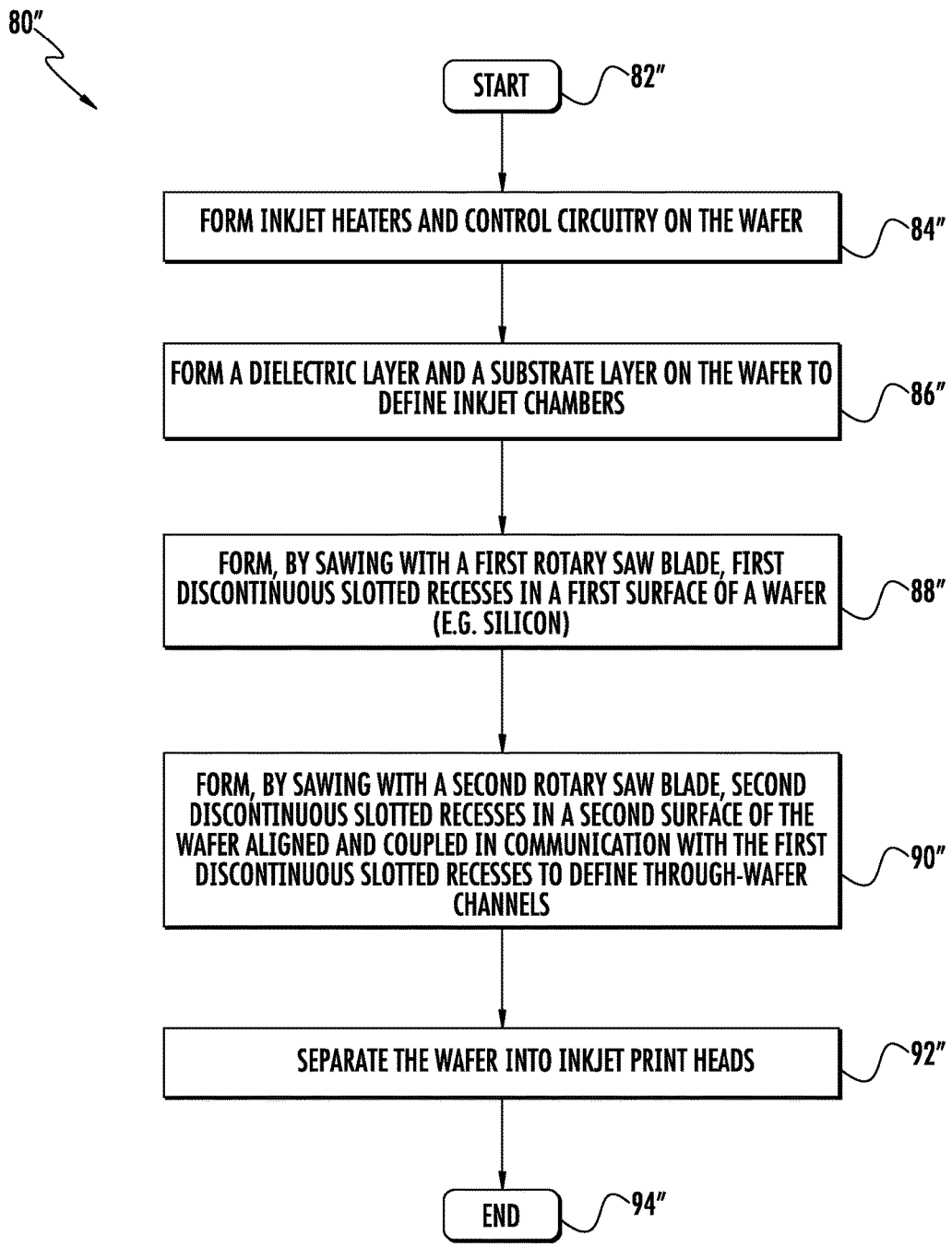
FIG. 11 is a flowchart of a method of making an inkjet print head in accordance with another embodiment of the invention.
Figure 12:
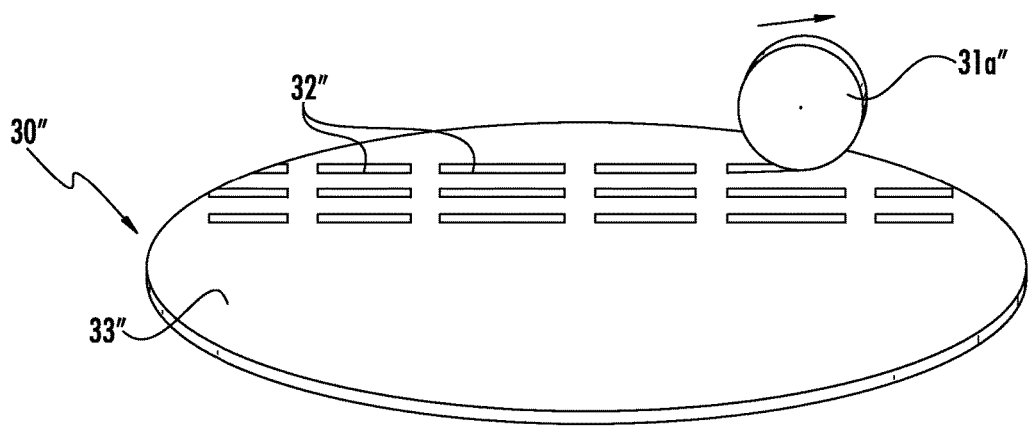
FIG. 12 is a perspective view of first discontinuous slotted recesses in a wafer formed according to the method in the flowchart of FIG. 11.
Figure 13:
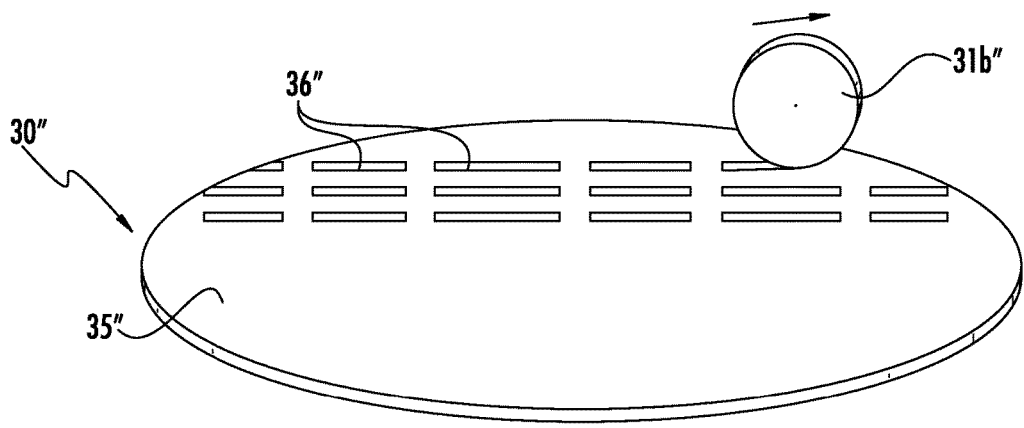
FIG. 13 is a perspective view of second discontinuous slotted recesses in a wafer formed according to the method in the flowchart of FIG. 3.

Referring now to the flowchart 80" in FIG. 11, and FIGS. 12 and 13, in another embodiment the first and second discontinuous slotted recesses 32", 36" may be formed by respective first and second rotary saw blades 31a", 31b". The other method steps are similar to those described above with respect the flowchart in FIG. 3, and FIGS. 4-7 and require no further discussion herein.

As will be appreciated by those skilled in the art, the methods described herein may advantageously reduce production costs, for example, by using cutting techniques and equipment that is readily available for conventional wafer dicing. Additionally, production efficiency may also be increased by using these relatively high-speed cutting techniques with respect to prior art approaches of etching, particle erosion, ablation, or a combination of these techniques.

Many modifications and other embodiments will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an inkjet print head comprising:
   advancing a first rotary saw blade along a first plurality of parallel paths while, for each path of the first plurality of parallel paths, periodically plunging and retracting the first rotary saw blade along the respective path of the first plurality of parallel paths to form a first plurality of spaced apart slotted recesses aligned along the respective path of the first plurality of parallel paths in a first surface of a wafer; and
   advancing a second rotary saw blade along a second plurality of parallel paths while, for each path of the second plurality of parallel paths, periodically plunging and retracting the second rotary saw blade along the respective path of the second plurality of parallel paths to form a second plurality of spaced apart slotted recesses aligned along the respective path of the second plurality of parallel paths in a second surface of the wafer coupled in communication with the first plurality of slotted recesses to define a plurality of through-wafer channels.

2. The method of claim 1, wherein the first and second pluralities of slotted recesses are formed to have a same depth into the wafer.

3. The method of claim 1, wherein the first plurality of slotted recesses are formed to have a depth into the wafer greater than a depth of the second plurality of slotted recesses.

4. The method of claim 1, wherein the first plurality of slotted recesses and the second plurality of slotted recesses are formed by making overlapping cuts into the wafer with the first and second rotary saw blades.

5. The method of claim 1, further comprising forming a plurality of inkjet heaters and control circuitry on the wafer.

6. The method of claim 1, further comprising forming at least one layer on the wafer to define a plurality of inkjet chambers.

7. The method of claim 6, wherein the at least one layer has a plurality of inkjet orifices formed in the at least one layer.

8. The method of claim 1, wherein the wafer comprises a silicon wafer.

9. The method of claim 1, wherein the first rotary saw blade comprises a first diamond rotary saw blade, and the second rotary saw blade comprises a second diamond rotary saw blade.

10. A method of making an inkjet print head comprising:
    advancing a first rotary saw blade along a first plurality of parallel paths while, for each path of the first plurality of parallel paths, periodically plunging and retracting the first rotary saw blade along the respective path of the first plurality of parallel paths to form a first plurality of spaced apart slotted recesses aligned along the respective path of the first plurality of parallel paths in a first surface of a silicon wafer; and
    advancing a second rotary saw blade along a second plurality of parallel paths while, for each path of the second plurality of parallel paths, periodically plunging and retracting the second rotary saw blade along the respective path of the second plurality of parallel paths to form a second plurality of spaced apart slotted recesses aligned along the respective path of the second plurality of parallel paths in a second surface of the silicon wafer coupled in communication with the first plurality of slotted recesses to define a plurality of through-wafer channels, wherein the first plurality of slotted recesses and the second plurality of slotted recesses being formed by making overlapping cuts into the silicon wafer with the first and second rotary saw blades.

11. The method of claim 10, further comprising forming a plurality of inkjet heaters and control circuitry on the silicon wafer.

12. The method of claim 10, further comprising forming at least one layer on the silicon wafer to define a plurality of inkjet chambers.

13. The method of claim 12, wherein the at least one layer has a plurality of inkjet orifices formed in the at least one layer.

14. The method of claim 10, wherein the first rotary saw blade comprises a first diamond rotary saw blade, and the second rotary saw blade comprises a second diamond rotary saw blade.

15. A method of making an inkjet print head comprising:
advancing a first rotary saw blade along a first plurality of parallel paths while, for each path of the first plurality of parallel paths, periodically plunging and retracting the first rotary saw blade along the respective path of the first plurality of parallel paths to form a first plurality of spaced apart slotted recesses aligned along the respective path of the first plurality of parallel paths in a first surface of a silicon wafer; and
advancing a second rotary saw blade along a second plurality of parallel paths while, for each path of the second plurality of parallel paths, periodically plunging and retracting the second rotary saw blade along the respective path of the second plurality of parallel paths to form a second plurality of spaced apart slotted recesses aligned along the respective path of the second plurality of parallel paths in a second surface of the silicon wafer coupled in communication with the first plurality of slotted recesses to define a plurality of through-wafer channels, wherein the first plurality of slotted recesses being formed to have a depth into the silicon wafer greater than a depth of the second plurality of slotted recesses.

16. The method of claim 15, further comprising forming a plurality of inkjet heaters and control circuitry on the silicon wafer.

17. The method of claim 15, further comprising forming at least one layer on the silicon wafer to define a plurality of inkjet chambers.

18. The method of claim 17, wherein the at least one layer has a plurality of inkjet orifices formed in the at least one layer.

19. The method of claim 15, wherein the first rotary saw blade comprises a first diamond rotary saw blade, and the second rotary saw blade comprises a second diamond rotary saw blade.

* * * * *